United States Patent

Onishi et al.

[11] Patent Number: 5,901,107
[45] Date of Patent: May 4, 1999

[54] SEMICONDUCTOR MEMORY DEVICE SELECTION METHOD AND CIRCUIT FOR EMBODYING THE SAME

[75] Inventors: Akihiro Onishi; Chohshichi Miyanaga, both of Higashi-Mastuyama, Japan

[73] Assignee: Zexel Corporation, Tokyo, Japan

[21] Appl. No.: 09/017,839

[22] Filed: Feb. 3, 1998

[30] Foreign Application Priority Data

Feb. 3, 1997 [JP] Japan .................................. 9-032583

[51] Int. Cl.⁶ ........................................................ G11C 7/00
[52] U.S. Cl. .............................. 365/230.06; 365/230.02; 365/195; 365/189.02; 365/185.11
[58] Field of Search .................. 365/230.06, 230.02, 365/195, 196, 230.03, 185.11, 185.23, 189.02, 189.01

[56] References Cited

U.S. PATENT DOCUMENTS

| | | | |
|---|---|---|---|
| 4,897,818 | 1/1990 | Redwine et al. | 365/195 |
| 5,426,753 | 6/1995 | Moon | 365/230.06 |
| 5,530,836 | 6/1996 | Busch et al. | 365/230.02 |
| 5,771,199 | 6/1998 | Lee | 365/230.03 |

*Primary Examiner*—Tan T. Nguyen
*Attorney, Agent, or Firm*—Wenderoth, Lind & Ponack, L.L.P.

[57] ABSTRACT

Only a first EEPROM 2 can output data according to an output signal of a selector circuit 5 when a "High" logical value signal and a "Low" logical value signal are output from first and second input/output terminals of a CPU 1 respectively. Conversely, only a second EEPROM 3 can output data according to the output signal of the selector circuit 5 when the "Low" logical value signal and the "High" logical value signal are output from the first and second input/output terminals respectively. The selector circuit 5 causes all the EEPROMs 2, 3 to turn into their inoperative states when the "High" logical value signals or the "Low" logical value signals are output from both the first and second input/output terminals respectively.

4 Claims, 4 Drawing Sheets

| | INPUT | | OUTPUT | | |
|---|---|---|---|---|---|
| | Ⓐ | Ⓑ | Ⓒ | Ⓓ | ROM SELECTION STATE |
| 1 | H | H | H | H | UNSELECTED |
| 2 | H | L | L | L | EEPROM1 SELECTED |
| 3 | L | H | H | L | EEPROM2 SELECTED |
| 4 | L | L | H | H | UNSELECTED |

FIG. 4

| | INPUT | | | | OUTPUT | | | | | | | | | |
|---|---|---|---|---|---|---|---|---|---|---|---|---|---|---|
| | D | C | B | A | Q0 | Q1 | Q2 | Q3 | Q4 | Q5 | Q6 | Q7 | Q8 | Q9 |
| 1 | L | L | L | L | H | L | L | L | L | L | L | L | L | L |
| 2 | L | L | L | H | L | H | L | L | L | L | L | L | L | L |
| 3 | L | L | H | L | L | L | H | L | L | L | L | L | L | L |
| 4 | L | L | H | H | L | L | L | H | L | L | L | L | L | L |
| 5 | L | H | L | L | L | L | L | L | H | L | L | L | L | L |
| 6 | L | H | L | H | L | L | L | L | L | H | L | L | L | L |
| 7 | L | H | H | L | L | L | L | L | L | L | H | L | L | L |
| 8 | L | H | H | H | L | L | L | L | L | L | L | H | L | L |
| 9 | H | L | L | L | L | L | L | L | L | L | L | L | H | L |
| 10 | H | L | L | H | L | L | L | L | L | L | L | L | L | H |
| 11 | H | L | H | L | L | L | L | L | L | L | L | L | L | L |
| 12 | H | L | H | H | L | L | L | L | L | L | L | L | L | L |
| 13 | H | H | L | L | L | L | L | L | L | L | L | L | L | L |
| 14 | H | H | L | H | L | L | L | L | L | L | L | L | L | L |
| 15 | H | H | H | L | L | L | L | L | L | L | L | L | L | L |
| 16 | H | H | H | H | L | L | L | L | L | L | L | L | L | L |

SEMICONDUCTOR MEMORY DEVICE SELECTION METHOD AND CIRCUIT FOR EMBODYING THE SAME

BACKGROUND OF THE INVENTION

1. Field of the Invention

The present invention relates to a method of selecting a semiconductor device applied to a circuit into which a plurality of semiconductor memory devices such as so-called ROMs, RAMs, etc. are incorporated and a circuit for embodying the same and, more particularly, improvements in a method of selecting one of a plurality of semiconductor memory devices without fail and a circuit for embodying such method.

2. Description of the Related Art

As one example of this kind of circuit in the prior art, there has been a circuit in which, for example, a so-called CPU (Central Processing Unit) and a plurality of ROMs are incorporated and the CPU can make desired one of the ROMs selectively turn into an operative state according to its own operation sequentially so as to read data from the desired ROM.

In FIG. 6, an example of the above circuit in the prior art is shown. Then, a configuration and an operation of the circuit for selecting the semiconductor memory device in the prior art will be explained in brief hereunder.

In this circuit, a predetermined program is carried out by a CPU 1 to execute operation control of respective portions of the circuit (not shown) and data processing. First and second EEPROMs (Electrically Erasable Programmable Read-Only Memories) 2, 3 in which data necessary for execution of the program are stored respectively are connected to the CPU 1. More particularly, a negative logic chip enable input terminal (portion labeled as "/CE" in FIG. 6) of the first EEPROM 2 is connected to a first input/output terminal (portion labeled as "I/O (1)" in FIG. 6) of the CPU 1. Similarly, a negative logic chip enable input terminal (portion labeled as "/CE" in FIG. 6) of the second EEPROM 3 is connected to a second input/output terminal (portion labeled as "I/O (2)" in FIG. 6) of the CPU 1. Respective serial data output terminals (portions labeled as "SOUT" in FIG. 6) of the first and second EEPROMs 2, 3 are connected together and then connected to a data input terminal (portion labeled as "DATA" in FIG. 6) of the CPU 1 such that a data output line can be used commonly.

According to the above configuration, reading of data from the EEPROMs 2, 3 to the CPU 1 can be effected by outputting a so-called chip enable signal as a control signal from the first input/output terminal I/O (1) or the second input/output terminal I/O (2) of the CPU 1 to select desired one of the first and second EEPROMs 2, 3.

Meanwhile, in the above circuit in the prior art, since the chip enable signal which is output from the CPU 1 to the first and second EEPROMs 2, 3 has to be output based on the program executed by the CPU 1, essentially such chip enable signal should be output only to either one of the first and second EEPROMs 2, 3. However, if there is some trouble, i.e., so-called bug in the program, sometimes the chip enable signal has been output simultaneously to both the first and second EEPROMs 2, 3. In this case, since the serial data output terminals SOUT of the first and second EEPROMs 2, 3 are connected together and then connected to the CPU 1, both the first and second EEPROMs 2, 3 are set to their data output states. In the worst case, there has been such a possibility that both the first and second EEPROMs 2, 3 are damaged. As a result, sufficient reliability has not been able to be assured in the above circuit in the prior art.

SUMMARY OF THE INVENTION

The present invention has been made in view of the above circumstances and it is an object of the present invention to provide a method of selecting a semiconductor device capable of selecting desired one of a plurality of semiconductor memory devices with the same function stably without fail and a circuit for embodying the same.

It is another object of the present invention to provide a method of selecting a semiconductor device capable of selecting one of a plurality of semiconductor memory devices without simultaneous selection of two or more semiconductor memory devices and a circuit for embodying the same.

It is still another object of the present invention to provide a method of selecting a semiconductor device capable of achieving a high reliability of a circuit by eliminating damage of semiconductor memory devices due to simultaneous selection caused in the prior art and a circuit for embodying the same.

In order to achieve the above objects of the present invention, according to a first aspect of the present invention, there is provided a semiconductor memory device selecting method of selecting desired one of a plurality of semiconductor memory devices whose data output terminals are mutually connected together, comprising the steps of:

generating a first signal for turning only a semiconductor memory device to be selected into its data output state based on a first external signal for identifying the semiconductor memory device to be selected, and then inputting the first signal into the semiconductor memory device to be selected; and generating a second signal for turning all the plurality of semiconductor memory devices into their data non-output states when a second external signal which is equivalent to simultaneous selection of more than two semiconductor memory devices is input, and then inputting the second signal into the plurality of semiconductor memory devices to thus select any one of the plurality of semiconductor memory devices regardless of simultaneous selection of more than two semiconductor memory devices.

With the above method, such an advantage can be achieved that, even if a signal for selecting more than two semiconductor memory devices simultaneously is input from the external device in error, a situation where more than two semiconductor memory devices are set to their data output states simultaneously can be avoided by turning all the semiconductor memory devices into their inoperative states. On the contrary, if a normal signal for selecting any one of the semiconductor memory devices is input from the external device, only the concerned semiconductor memory device is turned into its operative state. As a result, selection of the semiconductor memory device can be effected with high reliability.

In order to achieve the above objects of the present invention, according to a second aspect of the present invention, there is provided a semiconductor memory device selecting circuit for selecting desired one of a plurality of semiconductor memory devices whose data output terminals are mutually connected together, wherein the semiconductor memory device selecting circuit is provided between the plurality of semiconductor memory devices and an identification signal generating means which outputs a first external signal for identifying a semiconductor memory device to be selected from the plurality of semiconductor memory devices, the semiconductor memory device selecting circuit generates a first signal for turning the semiconductor memory device to be selected into its data output state based on a first external signal output from the identification signal generating means, and then outputs the first signal to the semiconductor memory device to be selected, and the semiconductor memory device selecting circuit generates a second signal for turning all the plurality of semiconductor memory devices into their data non-output states when a second external signal which is equivalent to simultaneous selection of more than two semiconductor memory devices is input from the identification signal generating means, and then outputs the second signal.

With the above configuration, the semiconductor memory device selecting circuit can be accomplished with the use of a logic circuit, for example. In particular, such another advantage can be achieved that, if a signal for selecting more than two semiconductor memory devices simultaneously is input in error from the identification signal generating means, a signal for causing all the semiconductor memory devices to turn into their inoperative states can be output, so that the situation where more than two semiconductor memory devices are set to their data output states simultaneously can be avoided.

Further, as the preferred embodiment of the present invention, the plurality of semiconductor memory devices are composed of two EEPROMs.

the identification signal generating means is composed of a CPU which is set previously to output a two-bit logical signal as a signal for identifying the EEPROM to be selected of the two EEPROMs, the two EEPROMs have chip enable input terminals for receiving negative logic inputs to turn the EEPROM into their data output states respectively, and data output terminals of the two EEPROMs are connected together and then connected to a data input terminal of the CPU, and the two-bit logical signal is input from the CPU to the semiconductor memory device selecting circuit, and output terminals of the semiconductor memory device selecting circuit are connected to the chip enable input terminals of the two EEPROMs respectively.

Furthermore, as the preferred embodiment of the present invention, the plurality of semiconductor memory devices are composed of a plurality of EEPROMs, the identification signal generating means is composed of a CPU which is set previously to output a logical signal for identifying the EEPROM to be selected of the plurality of EEPROMs, the plurality of EEPROMs have chip enable input terminals for receiving negative logic inputs to turn the EEPROM into their data output states respectively, and data output terminals of the two EEPROMs are connected together and then connected to a data input terminal of the CPU, and the semiconductor memory device selecting circuit is composed of a decoder which generates a negative logic signal based on the first external signal from the CPU, and then outputs the negative logic signal to the EEPROM to be selected.

BRIEF DESCRIPTION OF THE DRAWING

FIG. 4 is a truth value table for use in the circuit for selecting the semiconductor memory device shown in FIG. 3;

DESCRIPTION OF THE PREFERRED EMBODIMENTS

An embodiment of the present invention will be explained in detail with reference to the accompanying drawings hereinafter.

It is obvious for one skilled in the art that constituent members, parts, arrangements, etc. to be described hereinafter should be interpreted not to limit the present invention and therefore they may be changed, modified, or varied without departing a scope of the present invention.

First Example

Figure 6:
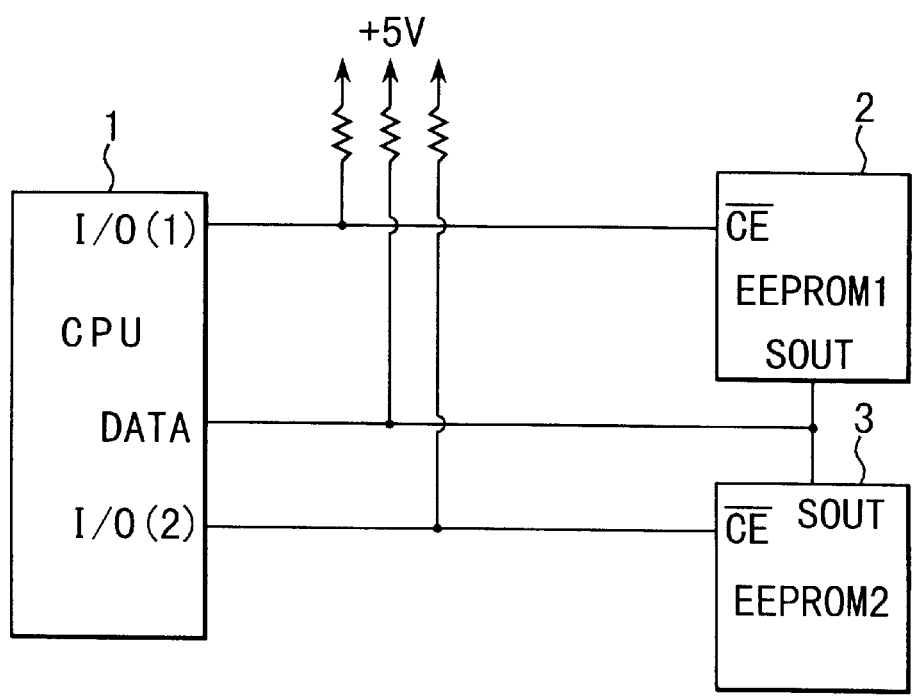
FIG. 6 is a circuit diagram showing a configuration of a circuit for selecting a semiconductor memory device in the prior art.

At first, a first example of a circuit for selecting a semiconductor memory device will be explained with reference to FIGS. 1 and 2 hereunder. It is to be noted that, throughout the following drawings, the same reference symbols are applied to the same constituent elements as those in the above conventional circuit shown in FIG. 6 and that the same or similar reference symbols are applied to the same or similar constituent elements.

First, this circuit according to the first example is so constructed that respective operations of the first and second EEPROMs (Electrically Erasable Programmable Read-Only Memories) 2, 3 (portions labeled as "EEPROM 1", "EEPROM 2" in FIG. 1) can be controlled with the use of the CPU 1 and that reading of data from the first and second EEPROMs 2, 3 to the CPU 1 is effected such that any one of the first and second EEPROMs 2, 3 can be always selected and then predetermined data processing, operational control of the circuit portions (not shown), etc. can be carried out by the CPU 1 using such read data.

Figures 1, 2:
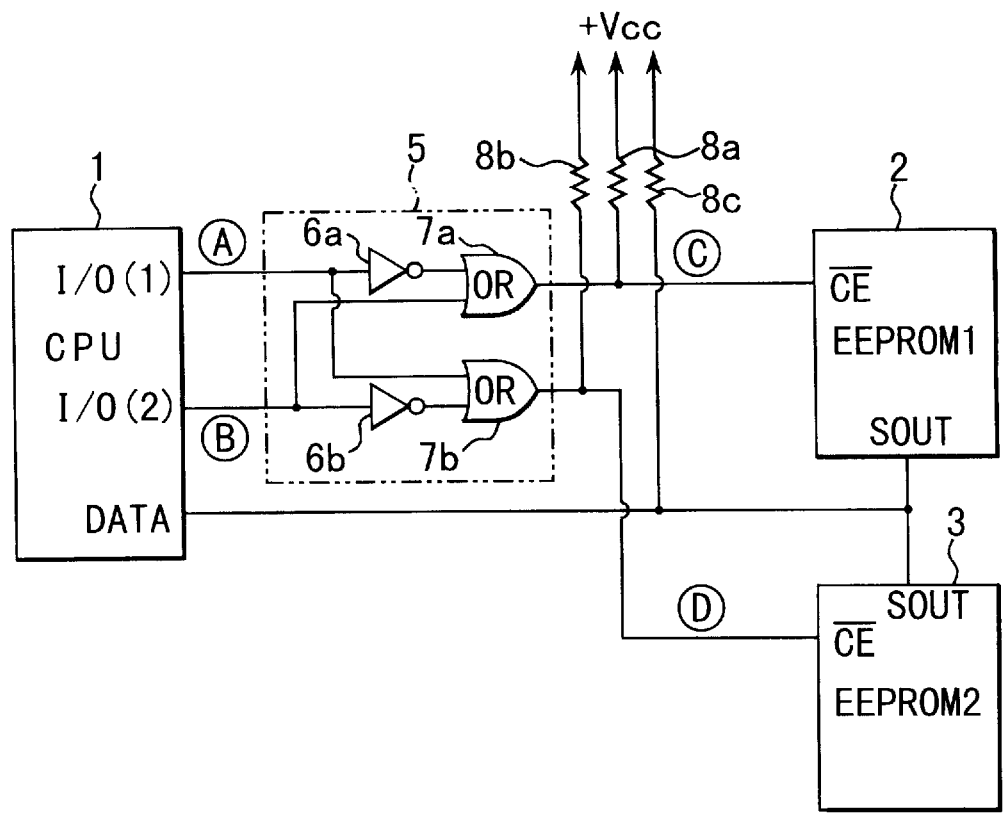
FIG. 1 is a circuit diagram showing a configuration of a first example of a circuit for selecting a semiconductor memory device according to an embodiment of the present invention.
FIG. 2 is a truth value table for use in the circuit for selecting the semiconductor memory device shown in FIG. 1.

The first input/output terminal (portion labeled as "I/O (1)" in FIG. 1) of the CPU 1 serving as an identification signal generating means is connected to a first input terminal (portion labeled as "A enclosed with a circle" in FIG. 1) of a selector circuit 5. The second input/output terminal (portion labeled as "I/O (2)" in FIG. 1) of the CPU 1 is connected to a second input terminal (portion labeled as "B enclosed with a circle" in FIG. 1) of the selector circuit 5. Thus the first and second EEPROMs 2, 3 can be selected appropriately by the CPU 1 via the selector circuit 5.

The selector circuit 5 is made up of first and second inverter elements 6a, 6b and first and second OR elements 7a, 7b. Based on control signals output from the first input/output terminal I/O (1) and the second input/output terminal I/O (2) of the CPU 1, the selector circuit 5 can output the chip enable signal which renders selectively to turn any one of the first and second EEPROMs 2, 3 into its operative state (their details will be described later). The first input/output terminal I/O (1) of the CPU 1 and one input terminal of the second OR element 7b are connected to an input terminal of the first inverter element 6a. An output terminal of the first inverter element 6a is connected to one input terminal of the first OR element 7a.

The second input/output terminal I/O (2) of the CPU 1 and the other input terminal of the first OR element 7a are connected to an input terminal of the second inverter element 6b. An output terminal of the second inverter element 6b is connected to the other input terminal of the second OR element 7b.

Output terminals of the first and second OR elements 7a, 7b are connected to power supply lines (not shown) via pull-up resistors 8a, 8b respectively. The output terminal of the first OR element 7a is also connected to a negative logic chip enable input terminal (portion labeled as "/CE" in FIG. 1) of the first EEPROM 2. The output terminal of the second OR element 7b is also connected to a negative logic chip enable input terminal (portion labeled as "/CE" in FIG. 1) of the second EEPROM 3.

The first and second EEPROMs 2, 3 are IC memories used to read dedicatedly data. The first and second EEPROMs 2, 3 are made up of such well known EEPROMs that reading of data is enabled when the negative logic signal is input into the negative logic chip enable input terminal.

Respective serial data output terminals (portions labeled as "SOUT" in FIG. 1) of the first and second EEPROMs 2, 3 are connected together and then connected to a power supply line (not shown) via a pull-up resistor 8c. In addition, respective serial data output terminals SOUT are also connected to a data input terminal (portion labeled as "DATA" in FIG. 1) of the CPU 1, so that a data output line is constructed to be commonly used.

In turn, an operation of the CPU 1 for selecting the first and second EEPROMs 2, 3 in the above configuration will be explained with reference to FIG. 2 hereunder.

At first, a situation will be discussed hereunder where, in order to set the first EEPROM 2 to a data reading state, a "High" logical value signal is output from a first input/output terminal I/O (1) of the CPU 1 and also a "Low" logical value signal is output from a second input/output terminal I/O (2) of the CPU 1.

In this case, the above "High" logical value signal is inverted into the "Low" logical value signal by the first inverter element 6a and then input into one input terminal of the first OR element 7a. The above "Low" logical value signal output from the second input/output terminal I/O (2) of the CPU 1 is input into the other input terminal of the first OR element 7a. As a result, the "Low" logical value signal is input into the negative logic chip enable input terminal /CE of the first EEPROM 2, so that the first EEPROM 2 can output data from its serial data output terminal SOUT.

Similarly, the above "High" logical value signal output from the first input/output terminal I/O (1) of the CPU 1 is input into one input terminal of the second OR element 7b. The above "Low" logical value signal is inverted into the "High" logical value signal by the second inverter element 6b and then input into the other input terminal of the second OR element 7b. Hence, the "High" logical value signal is output from the second OR element 7b and then input into the negative logic chip enable input terminal /CE of the second EEPROM 3. As a result, the second EEPROM 3 is turned into its inoperative state, so that the second EEPROM 3 cannot output data from its serial data output terminal SOUT.

In a truth value table shown in FIG. 2, input/output states of the selector circuit 5 corresponding to the above conditions are set forth in the "2" row. In the table shown in FIG. 2, a column C enclosed with a circle denotes output states of the first OR element 7a, and a column D enclosed with a circle denotes output states of the second OR element 7b. In FIG. 2, "H" denotes the "High" logical value and "L" denotes the "Low" logical value.

On the contrary to the above situation, another situation will be discussed hereunder where the "Low" logical value signal is output from the first input/output terminal I/O (1) of the CPU 1 and also the "High" logical value signal is output from the second input/output terminal I/O (2) of the CPU 1. In this case, the "High" logical value signal can be output from the first OR element 7a and also the "Low" logical value signal can be output from the second OR element 7b (see the "3" row in the truth value table in FIG. 2). As a result, the first EEPROM 2 is turned into its inoperative state, so that data can be output from the serial data output terminal SOUT of the second EEPROM 3.

Subsequently, still another situation will be discussed hereunder where the "High" logical value signals are simultaneously output from both the first input/output terminal I/O (1) and the second input/output terminal I/O (2) of the CPU 1 in error due to any cause, for example, a bug in the program executed by the CPU 1, etc.

In this case, since the "High" logical value signals are output from both the first OR element 7a and the second OR element 7b (see the "1" row in the truth value table in FIG. 2), both the first and second EEPROMs 2, 3 are turned into their inoperative states. As a consequence, conflict of data output from the first and second EEPROMs 2, 3 can be prevented.

Similarly, even if the "Low" logical value signals are output simultaneously from both the first input/output terminal I/O (1) and the second input/output terminal I/O (2) of the CPU 1, the "High" logical value signals are output from both the first OR element 7a and the second OR element 7b (see the "4" row in the truth value table in FIG. 2). Therefore, both the first and second EEPROMs 2, 3 are turned into their inoperative states and thus conflict of data output from the first and second EEPROMs 2, 3 can be prevented.

Second Example

Next, a second example of the circuit for selecting the semiconductor memory device according to the embodiment of the present invention will be explained with reference to FIGS. 3 and 4 hereunder.

This second example is so constructed that, in a circuit in which three EEPROMs are incorporated, the CPU 1 can select any one of three EEPROMs regardless of simultaneous selection of three EEPROMs. In FIG. 3, the same references are applied to the same constituent elements as those in the first example which has been explained with reference to FIG. 1 previously, and their detailed explanation will be omitted in this disclosure. Different respects of the second example from the first example in configuration and operation will be mainly explained hereinbelow.

In the second example, first to third EEPROMs 2 to 4 are provided to supply data to the CPU 1. Respective negative logic chip enable input terminals /CE of the first to third EEPROMs 2 to 4 are connected to the CPU 1 via a selector circuit 5A.

The selector circuit 5A is made up of a decoder 9 and three inverter elements 6a to 6c. In the second example, a generalpurpose IC which is generally called a "BCD TO DECIMAL DECODER" and used only for a decoder is employed as the decoder 9. An input terminal A (portion labeled as "A" in FIG. 3) of the decoder 9 is connected to a first input/output terminal I/O (1) of the CPU 1, an input terminal B (portion labeled as "B" in FIG. 3) of the decoder 9 is connected to a second input/output terminal I/O (2) of the CPU 1, an input terminal C (portion labeled as "C" in FIG. 3) of the decoder 9 is connected to a third input/output terminal I/O (3) of the CPU 1, and an input terminal D (portion labeled as "D" in FIG. 3) of the decoder 9 is connected to a fourth input/output terminal I/O (4) of the CPU 1. Therefore, respective control signals can be input selectively into respective input terminals A, B, C, D from the CPU 1 in response to selection of the first to third EEPROMs 2 to 4.

Figure 3:
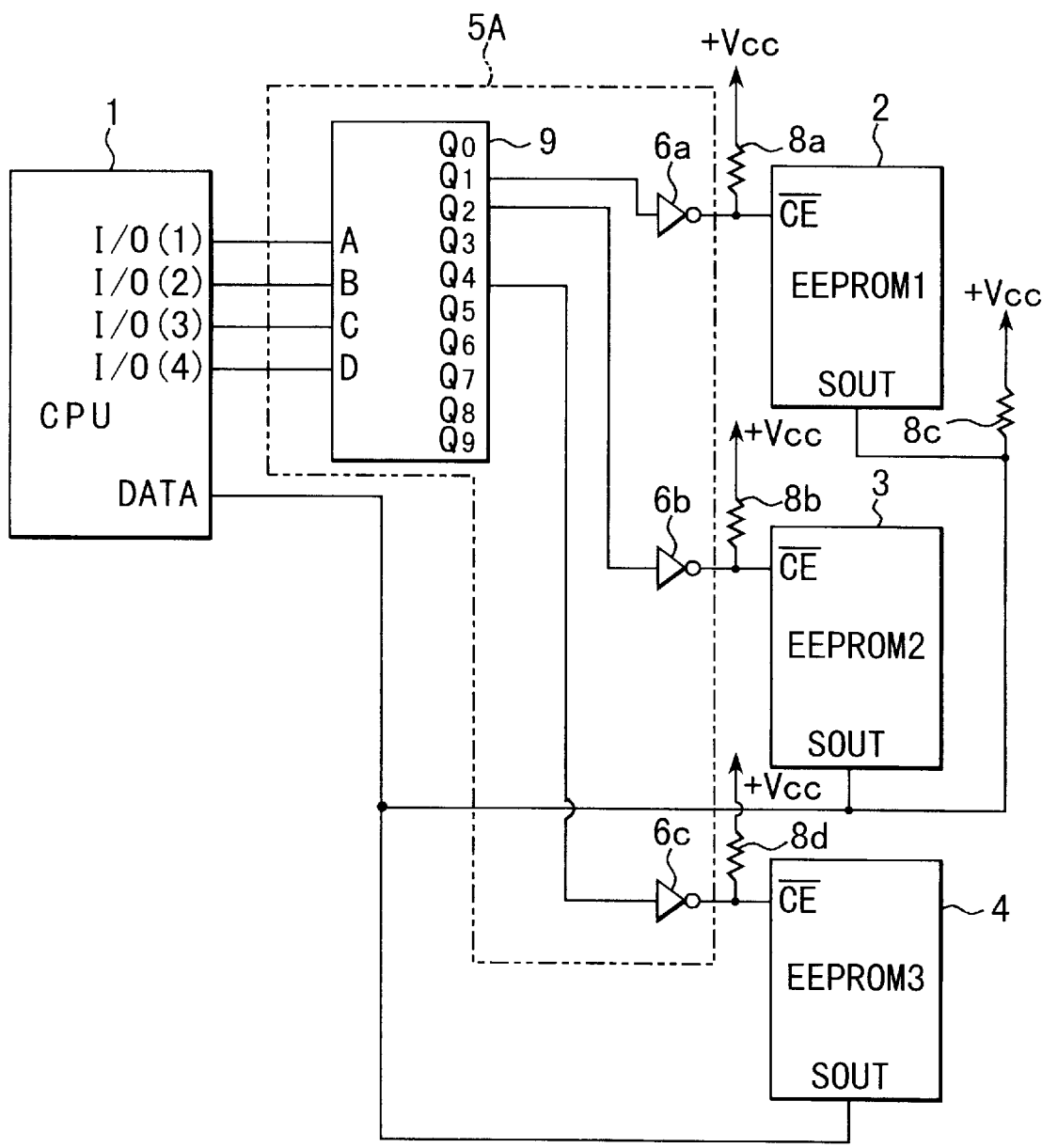
FIG. 3 is a circuit diagram showing a configuration of a second example of the circuit for selecting the semiconductor memory device according to the embodiment of the present invention.

Furthermore, the decoder 9 has ten output terminals (portions labeled as "Q0 to Q9" in FIG. 3). Out of ten output terminals of the decoder 9, the output terminal Q1 is connected to the negative logic chip enable input terminal /CE of the first EEPROM 2 via the first inverter element 6a, the output terminal Q2 is connected to the negative logic chip enable input terminal /CE of the second EEPROM 3 via the second inverter element 6b, and the output terminal Q4 is connected to the negative logic chip enable input terminal /CE of the third EEPROM 4 (portion labeled as "EEPROM 3" in FIG. 3) via a third inverter element 6c.

Respective serial data output terminals (portions labeled as "SOUT" in FIG. 3) of the first to third EEPROMs 2 to 4 are connected together and then connected to the data input terminal (portion labeled as "DATA" in FIG. 3) of the CPU 1.

Output stages of the first to third inverter elements 6a to 6c are connected to the power supply line (not shown) via pull-up resistors 8a, 8b, 8d. Respective serial data output terminals SOUT of the first to third EEPROMs 2 to 4 are connected to the power supply line (not shown) via a pull-up resistor 8c.

An operation of the second example of the circuit for selecting the semiconductor memory device will be explained hereunder.

At first, it is supposed that the "High" logical value signal is output from the first input/output terminal I/O (1) of the CPU 1 to read data from the first EEPROM 2, the "High" logical value signal is output from the second input/output terminal I/O (2) of the CPU 1 to read data from the second EEPROM 3, and the "High" logical value signal is output from the third input/output terminal I/O (3) of the CPU 1 to read data from the third EEPROM 4.

In response to respective logic signals input into the input terminals A to D, the decoder 9 can output respective logical signals shown in a truth value table in FIG. 4 from the output terminals Q0 to Q9.

More particularly, if the input terminals A to D are set in the range from logical values "LLLL" to logical values "HLLH" in sequence from the input terminal D side (i.e., in the range from "1" row to "10" row in FIG. 4), the decoder 9 can output the "High" logical value signal from only any one of the output terminals Q0 to Q9 in sequence from the output terminal Q0 side. In addition, if the input terminals A to D are set to logical values "HLHL" et seq. sequentially from the input terminal D side (i.e., "11" row et seq. in FIG. 4), the decoder 9 can output only the "Low" logical value signals from all output terminals Q0 to Q9.

If the input terminals A to D of the decoder 9 are set to the logical value "LLLH" by the CPU 1 sequentially from the input terminal D side, only the output terminal Q1 of the decoder 9 can output the "High" logical value signal (see the "2" row in FIG. 4). Such "High" logical value signal is then inverted into the "Low" logical value signal by the first inverter element 6a, so that only the negative logic enable input terminal /CE of the first EEPROM 2 can be set to the "Low" logical value. As a result, data can be output only from the first EEPROM 2 to be read by the CPU 1.

Further, if the input terminals A to D of the decoder 9 are set to the logical value "LLHL" by the CPU 1 sequentially from the input terminal D side, only the output terminal Q2 of the decoder 9 can output the "High" logical value signal (see the "3" row in FIG. 4) Such "High" logical value signal is then inverted into the "Low" logical value signal by the second inverter element 6b, so that only the negative logic enable input terminal /CE of the second EEPROM 3 can be set to the "Low" logical value. As a result, data can be output only from the second EEPROM 3 to be read by the CPU 1.

Furthermore, if the input terminals A to D of the decoder 9 are set to the logical value "LHLL" by the CPU 1 sequentially from the input terminal D side, only the output terminal Q4 of the decoder 9 can output the "High" logical value signal (see the "5" row in FIG. 4). Such "High" logical value signal is then inverted into the "Low" logical value signal by the third inverter element 6c, so that only the negative logic enable input terminal /CE of the third EEPROM 4 can be set to the "Low" logical value. As a result, data can be output only from the third EEPROM 4 to be read by the CPU 1.

Even if the logical signal levels of the input terminals A to D of the decoder 9 are set other than the above three set states, there is no possibility that the "High" logical value signal can be output from respective output terminals Q1, Q2, and Q4. Therefore, the first to third EEPROMs 2, 3, 4 are in no way turned into their active states.

Although, in the second example, the case has been discussed where only any one of three EEPROMs 2, 3, 4 should be selected, it is needless to say that, if the decoder 9 used in the second example is employed, the present invention is not limited to three EEPROMs and therefore any one of four EEPROMs or more may be selected in the same manner as above. In addition, it is a matter of course that, even if the selection signals for more than two EEPROMs are output in error from the CPU 1, simultaneous selection of a plurality of EEPROMs can be surely avoided.

Third Example

The configuration of the above selector circuit 5 explained in the first example is not limited to the configuration shown in FIG. 1. It is of course that another configuration may be adopted as the selector circuit 5 if the truth value table shown in FIG. 2 can be satisfied. For example, a configuration of a selector circuit 5B shown in FIG. 5 may be employed as the configuration to execute the same function.

Figure 5:
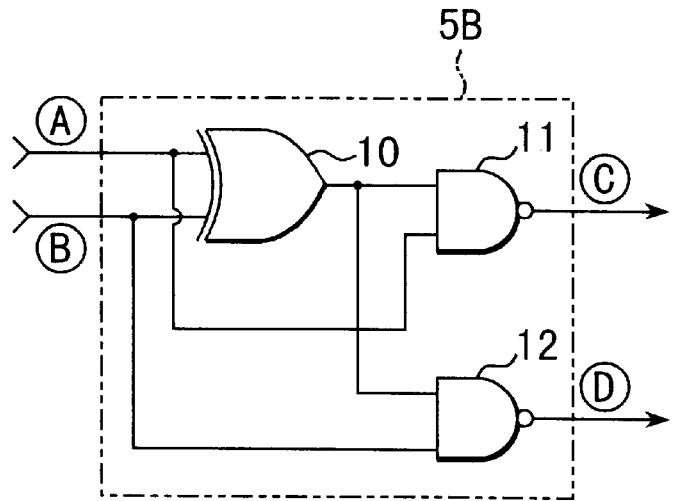
FIG. 5 is a circuit diagram showing a configuration of a third example of the circuit for selecting the semiconductor memory device according to the embodiment of the present invention, wherein another configuration of the selector circuit in the circuit shown in FIG. 1 is employed.

More particularly, the selector circuit 5B shown in FIG. 5 is composed of an exclusive-OR element 10 and two NAND elements 11, 12. Two input terminals of the exclusive-OR element 10 are connected to the first input/output terminal I/O (1) and the second input/output terminal I/O (2) of the CPU 1 respectively. An output terminal of the first NAND element 11 is connected to the negative chip enable input terminal /CE of the first EEPROM 2. An output terminal of the second NAND element 12 is connected to the negative chip enable input terminal /CE of the second EEPROM 3.

In addition, an output terminal of the exclusive-OR element 10 is connected to one input terminals of the first and second NAND elements 11, 12. The other input terminal of the first NAND element 11 is connected to one input terminal of the exclusive-OR element 10 and also the other input terminal of the second NAND element 12 is connected to the other input terminal of the exclusive-OR element 10.

In the above configuration, an operation of the selector circuit 5B to output the output signals in response to the input signals is not basically different from that of the selector circuit 5 shown in FIG. 1. For this reason, detailed explanation as for the operation of the selector circuit 5B will be omitted in this disclosure.

Though data have been output from the EEPROMs 2 to 4 in a serial format in any one of the above-mentioned examples, the present invention is not limited to the serial format. It is of course that a parallel data output format may be employed.

Moreover, in any one of the above-mentioned examples, either one of the EEPROMs 2 to 4 has been selected via the selector circuit 5 (5A, or 5B) based on the control signals output from the CPU 1 to select the EEPROMs 2 to 4, but the element for outputting the control signals to be input into the selector circuit 5 (5A, or 5B) is not limited to the CPU 1. Other elements such as latch ICs as well as the CPU 1 may be employed if they can output similar control signals.

Besides, the EEPROMs have been employed as the semiconductor memory devices in the above-mentioned examples, but the present invention is not limited to such EEPROMs. It is evident for one skilled in the art that other configuration may be employed if such memory device can perform the same function as above.

As stated above, according to the present invention, even if the signal for selecting simultaneously a plurality of semiconductor memory devices is input in error from the outside, only desired one of the semiconductor memory devices can be surely selected since the circuit is constructed such that more than two semiconductor memory devices can be avoided from being selected at the same time. Therefore, circuit operations can be stabilized and ensured and as a result reliability of the circuit can be improved.

Since the situation can be eliminated where two semiconductor memory devices or more are simultaneously selected, damage of the semiconductor memory devices in the prior art because of such simultaneous selection of the semiconductor memory devices can be eliminated. As a result, a circuit with higher reliability can be accomplished according to the present invention.

What is claimed is:

1. A semiconductor memory device selecting method of selecting desired one of a plurality of semiconductor memory devices whose data output terminals are mutually connected together, comprising the steps of:

generating a first signal for turning only a semiconductor memory device to be selected into its data output state based on a first external signal for identifying the semiconductor memory device to be selected, and then inputting the first signal into the semiconductor memory device to be selected; and generating a second signal for turning all the plurality of semiconductor memory devices into their data non-output states when a second external signal which is equivalent to simultaneous selection of more than two semiconductor memory devices is input, and then inputting the second signal into the plurality of semiconductor memory devices to thus select any one of the plurality of semiconductor memory devices regardless of simultaneous selection of more than two semiconductor memory devices.

2. A semiconductor memory device selecting circuit for selecting desired one of a plurality of semiconductor memory devices whose data output terminals are mutually connected together, wherein the semiconductor memory device selecting circuit is provided between the plurality of semiconductor memory devices and an identification signal generating means which outputs a first external signal for identifying a semiconductor memory device to be selected from the plurality of semiconductor memory devices, the semiconductor memory device selecting circuit generates a first signal for turning the semiconductor memory device to be selected into its data output state based on a first external signal output from the identification signal generating means, and then outputs the first signal to the semiconductor memory device to be selected, and the semiconductor memory device selecting circuit generates a second signal for turning all the plurality of semiconductor memory devices into their data non-output states when a second external signal which is equivalent to simultaneous selection of more than two semiconductor memory devices is input from the identification signal generating means, and then outputs the second signal.

3. A semiconductor memory device selecting circuit according to claim 2, wherein the plurality of semiconductor memory devices are composed of two EEPROMs, the identification signal generating means is composed of a CPU which is set previously to output a two-bit logical signal as a signal for identifying the EEPROM to be selected of the two EEPROMs, the two EEPROMs have chip enable input terminals for receiving negative logic inputs to turn the EEPROM into their data output states respectively, and data output terminals of the two EEPROMs are connected together and then connected to a data input terminal of the CPU, and the two-bit logical signal is input from the CPU to the semiconductor memory device selecting circuit, and output terminals of the semiconductor memory device selecting circuit are connected to the chip enable input terminals of the two EEPROMs respectively.

4. A semiconductor memory device selecting circuit according to claim 2, wherein the plurality of semiconductor memory devices are composed of a plurality of EEPROMs, the identification signal generating means is composed of a CPU which is set previously to output a logical signal for identifying the EEPROM to be selected of the plurality of EEPROMs, the plurality of EEPROMs have chip enable input terminals for receiving negative logic inputs to turn the EEPROM into their data output states respectively, and data output terminals of the two EEPROMs are connected together and then connected to a data input terminal of the CPU, and the semiconductor memory device selecting circuit is composed of a decoder which generates a negative logic signal based on the first external signal from the CPU, and then outputs the negative logic signal to the EEPROM to be selected.

* * * * *